United States Patent [19]
Lee

[11] 3,755,693
[45] Aug. 28, 1973

[54] COUPLING CIRCUIT

[75] Inventor: James Yat Lee, New Brunswick, N.J.
[73] Assignee: RCA Corporation, New York, N.Y.

[22] Filed: Aug. 30, 1971
[21] Appl. No.: 176,177

[52] U.S. Cl. .................. 307/237, 307/208, 307/215, 307/218, 307/270, 307/280
[51] Int. Cl. .... H03k 5/08, H03k 19/30, H03k 19/34
[58] Field of Search .................... 307/208, 213, 214, 307/215, 218, 237, 264, 270, 280, 300; 328/171, 175; 330/30 D

[56] References Cited

UNITED STATES PATENTS

| | | | |
|---|---|---|---|
| 3,233,125 | 2/1966 | Buie | 307/299 A |
| 3,259,761 | 7/1966 | Narud et al. | 307/215 |
| 3,501,647 | 3/1970 | Giacomo | 307/214 |
| 3,581,107 | 5/1971 | Nielsen | 307/215 |
| 3,402,334 | 9/1968 | Newton, Jr. | 307/270 X |
| 3,436,563 | 4/1969 | Regitz | 307/270 |
| 3,083,303 | 3/1963 | Knowles et al. | 307/280 X |
| 3,092,729 | 6/1963 | Cray | 307/300 X |
| 3,222,545 | 12/1965 | Candy | 307/300 X |
| 3,366,889 | 1/1968 | Avins | 330/30 D |
| 2,999,169 | 9/1961 | Feiner | 328/175 X |
| 3,491,251 | 1/1970 | Witsell | 307/215 |
| 3,555,294 | 1/1971 | Treadway | 307/215 X |

FOREIGN PATENTS OR APPLICATIONS

| | | | |
|---|---|---|---|
| 771,322 | 11/1967 | Canada | 307/280 |

OTHER PUBLICATIONS

Antipov et al., "High Speed Inverting Level Setter," IBM Technical Bulletin, p. 89, Vol. 2, No. 6, 4/1960.
Reiffin, "Feed Clamp" and "Single-State Gate with Noninverting Feedback" IBM Tech. Disclosure, Bulletin, pgs. 1985–1988, Vol. 12, No. 11, 4/1970.

*Primary Examiner*—John W. Huckert
*Assistant Examiner*—L. N. Anagnos
*Attorney*—H. Christoffersen

[57] ABSTRACT

A by-pass circuit, including a diode, is located in a circuit which couples the output signal of a saturated logic circuit to the input circuit to a non-saturated logic circuit, such as an emitter-coupled logic (ECL) circuit. For output signals of lower than a given value, the by-pass circuit does not affect this signal. When the signal increases above said given value, feedback from the non-saturated logic circuit applied to the diode, causes the by-pass circuit to shunt a sufficient portion of this signal to prevent the ECL circuit from saturating.

11 Claims, 1 Drawing Figure

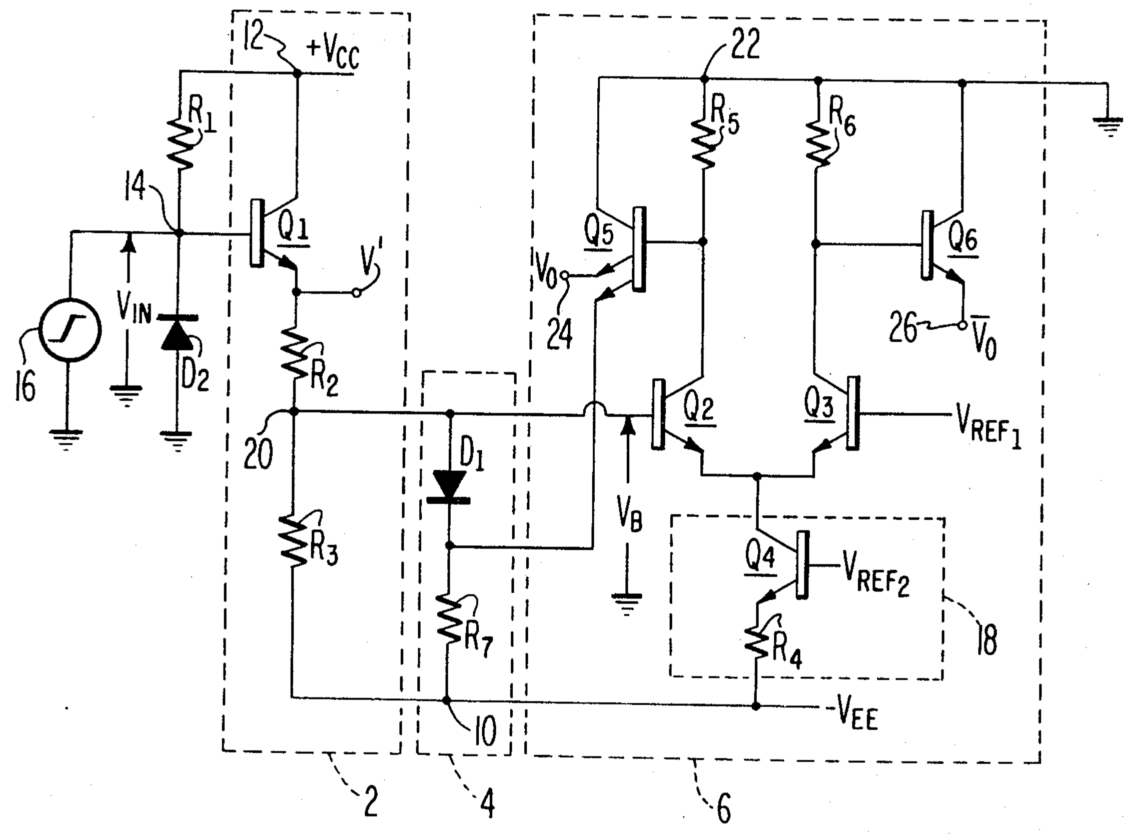
INVENTOR.
James Y. Lee
BY
Henry Schanzer
ATTORNEY

COUPLING CIRCUIT

BACKGROUND OF THE INVENTION

In logic systems it is often desirable and/or necessary to use in the same system different families of logic circuits to perform different functions. For example, where speed is important, non-saturated logic circuits such as emitter-coupled logic (ECL) circuits may be used. Where speed is of less importance, saturated logic circuits, such as transistor-transistor logic (TTL) or diode-transistor logic (DTL) circuits, both of which can be cheaper and less power consuming than ECL circuits, may be used.

At places where the circuits of one logic family meet another, they must be coupled. However, the signals at the interfaces are not necessarily compatible. For example, the signals produced by saturated logic circuits may have much larger voltage swings than those suitable as inputs to non-saturated logic circuits. A saturated logic circuit may produce an output signal which swings between 0 volts and 4.2 volts and may have to be coupled to a circuit which requires an input signal whose swing is limited to less than a volt.

The problem above is complicated by the fact that normally it is desirable that the driven circuit switch from one state to the other when the signal produced by the saturated logic circuit changes some small amount from a reference voltage level such as the mid point between the high and low values of its voltage swing. Thus, by way of example, it may be desirable that the driven circuit be switched when the saturated logic signal changes in a given sense say 0.1 to 0.4 volts from a reference level of 2.1 volts. However, the change in state of the driven circuit must be accomplished without saturation, that is, the change in input signal level from its reference level to its maximum level must not be allowed to saturate the driven stage. Otherwise, a substantial decrease in speed of the driven stage would result.

For example, U.S. Pat. No. 3,581,107, entitled "Digital Logic Clamp for Limiting Power Consumption of Interface Gate" issued to Einer D. Nielsen discloses an interface circuit in which the input is clamped to a low value of potential when the input signal exceeds a given level. However, the clamping circuit is activated only when the output stage of the interface circuit saturates. The saturation of the stage slows down the response of the circuit limiting its usefulness in those applications where speed of response is a prime requisite.

The purpose of the present invention is to provide an improved solution to the problem above.

SUMMARY OF THE INVENTION

A transistor having a controllable shunt path connected in its base circuit and feedback means connected between one of its emitter and collector electrodes and the shunt path. In response to signals applied to the base of said transistor of greater than a given value the feedback means enables part of the signal current to flow through the shunt path thereby preventing the collector-to-base region of said transistor from being forward biased.

BRIEF DESCRIPTION OF THE DRAWING

The sole FIGURE is a schematic drawing of a circuit embodying the invention.

DETAILED DESCRIPTION OF THE INVENTION

The circuit of the sole FIGURE includes a level shift and signal attenuation network 2, a clamp network 4, and an emitter-coupled logic (ECL) circuit 6.

The network 2, includes transistor $Q_1$ connected at its collector to terminal 12 and through resistors $R_2$ and $R_3$ to terminal 10. A positive voltage $+V_{CC}$, such as +5 volts, is applied to terminal 12. A resistor $R_1$ is connected between the base and collector of transistor $Q_1$ and a diode $D_2$ is connected at its cathode to the base and at its anode to ground. Signal source 16, connected between the circuit input terminal 16 at the base of transistor $Q_1$ and ground, represents any source of signal whose output normally varies between zero volts and $+V_{CC}$ volts. The signal produced by signal source 16 may exceed these values but the collector-to-base diode of transistor $Q_1$ prevents signals much in excess of $+V_{CC}$ from being developed at terminal 14 and diode $D_2$ connected between terminal 14 and ground potential prevents negative signals much below ground potential from being developed at terminal 14.

The clamp circuit 4, includes diode $D_1$ and resistor $R_7$. The diode is connected at its anode to node 20 between resistors $R_2$ and $R_3$ and at its cathode to one end of resistor $R_7$. The other end of resistor $R_7$ is connected to terminal 10.

The ECL circuit 6, also known as a current mode switch, includes five transistors $Q_2$ to $Q_6$. Transistors $Q_2$ and $Q_3$ are connected at their emitters to the collector of transistor $Q_4$ and at their collectors through resistors $R_5$ and $R_6$, respectively, to terminal 22 which is at ground. Transistor $Q_3$ is connected at its base to a reference voltage source $V_{REF_1}$, and transistor $Q_2$ is connected at its base to node 20.

Transistor $Q_4$ is connected at its base to a second reference voltage source $V_{REF_2}$ and at its emitter through resistor $R_4$ to the $-V_{EE}$ voltage terminal 10. The circuit 18 which includes transistor $Q_4$ operates as a constant current source for the current switch $Q_2$, $Q_3$. With $-V_{EE}$, $V_{REF_2}$ and resistor $R_4$ relatively constant, the collector current $I_K$ of transistor $Q_4$ remains substantially constant and is virtually independent of the variations in the base voltages of transistors $Q_2$ and $Q_3$.

Emitter follower transistor $Q_5$ is connected at its base to the collector of transistor $Q_2$, at its collector to terminal 22, at one of its emitters to output terminal 24 and at its other emitter to the cathode of diode $D_1$. Emitter follower transistor $Q_6$ is connected at its base to the collector of transistor $Q_3$, at its collector to terminal 22, and at its emitter to output terminal 26. This circuit produces an output signal $V_o$ at terminal 26 which signal is the complement of the signal $V_o$ produced at terminal 24 at the emitter of transistor $Q_5$.

The operation of circuit 2 is straightforward. When $V_{IN}$ goes positive, diode $D_2$ cuts off, and the base of transistor $Q_1$ is pulled up in value to $+V_{CC}$. This drives the transistor to saturation and a relatively large positive going signal develops at node 20.

The operation of the circuit 6 may best be understood by reviewing the operation of the ECL circuit for different voltage levels at node 20 (the voltage $V_B$ applied to the base of transistor 20). When this voltage is equal to $V_{REF_1}$, the transistors $Q_2$ and $Q_3$ conduct substantially equal currents. The current each transistor carries is approximately equal to one half $I_K$ (the current produced by constant current source 18).

When the potential ($V_B$) applied to the base of transistor $Q_2$ is below $V_{REF_1}$, transistor $Q_3$ conducts a greater portion of $I_K$ than does transistor $Q_2$. In fact, when $V_B$ gets to be approximately 100 to 150 millivolts below $V_{REF_1}$, the full current $I_K$ flows through the collector to emitter path of transistor $Q_3$ and substantially no current flows through the collector to emitter path of transistor $Q_2$. The collector potential ($V_C$) of transistor $Q_2$ is then very nearly equal to ground potential and the $V_C$ of transistor $Q_3$ is equal to −0.9 volts ($R_6$ multiplied by $I_K$). Under this condition, transistor $Q_5$ produces a signal $V_o$ at both of its emitters which is equal to approximately −0.8 volts (the base-to-emitter forward drop ($V_{BE}$) of the transistors is assumed to be equal to 0.8 volts) and transistor $Q_6$ produces a signal $V_o$ at terminal 26 which is equal to approximately −1.7 volts (−0.9 volts $-V_{BE}$ of transistor $Q_6$). Any further decrease in $V_B$ has no substantial effect on the output signals which remain constant. As further explained below, for $V_B$ equal to or less than $V_{REF_1}$ diode $D_1$ is reverse biased and the shunt path has no effect on the circuit.

When $V_B$ rises above $V_{REF_1}$, transistor $Q_2$ conducts a greater portion of $I_K$ than does $Q_3$. In fact, when $V_B$ exceeds $V_{REF_1}$ by 100 to 150 millivolts, substantially the full $I_K$ current flows through the collector-to-emitter path of transistor $Q_2$ and virtually no current flows through transistor $Q_3$. For this signal condition, the potential $V_C$ at the collector of transistor $Q_3$ is close to zero volts and the $V_C$ of transistor $Q_2$ is approximately −0.9 volts ($I_K$ multiplied by $R_5$). The potential at terminal 24 and at the second emitter of transistor $Q_5$ (assuming the $V_{BE}$ drop to be approximately 0.8 volts) is approximately −1.7 volts.

Diode $D_1$ now has −1.7 volts applied to its cathode. Diode $D_1$ can now conduct whenever the potential at its anode ($V_B$) exceeds −1.7 volts by a few tenths of a volt. Thus, when the potential at $V_B$ rises above a given level, transistor $Q_2$ conducts and pulls down the base of transistor $Q_5$. The potential at the base of transistor $Q_5$ is then fed back to the cathode of diode $D_1$ and the diode conducts if $V_B$ rises sufficiently above −1.7 volts.

When the $V_C$ of transistor $Q_2$ is equal to −0.9 volts, it is important that its base voltage does not rise above −0.9 volts. The reason is that otherwise the base will be forward biased with respect to the collector and the transistor will go into saturation. Once in saturation, it takes considerably more time to turn off the device and its usefulness as a high speed circuit is seriously impaired.

It will now be shown that by use of a controllable shunt path in the base circuit of transistor $Q_2$, the base voltage can be controlled to prevent its rise above a level which will cause the input transistor $Q_2$ from saturating.

The translation of the input signal ($V_{IN}$) from terminal 14 to node 20 will be examined under two extreme conditions. One, when the diode is reverse biased and the shunt path is out of the circuit and the second when the diode is conducting and, for ease of explanation, is assumed to be a switch.

Transistor $Q_1$ operated as an emitter follower produces at its emitter a signal, denoted as V′, which is equal to the signal present at terminal 14 minus the $V_{BE}$ drop of transistor $Q_1$. Assume that diode $D_1$ is reverse biased and non-conducting and that the input impedance looking into the base of transistor $Q_2$ is extremely high. UNder this condition, the potential $V_B$ at node 20 may be expressed as follows:

Eq. 1

$$V_B = V_{EE} + \frac{[V' - (V_{EE})]R_3}{R_2 + R_3}$$

$$= V_{EE}\left[1 - \frac{R_3}{R_2 + R_3}\right] + V'\left[\frac{R_3}{R_2 + R_3}\right]$$

where $V_{EE}$ is a negative potential (e.g., $V_{EE} = -5v$).

An examination of the equation reveals that the V′ term is attenuated by the ratio of $R_3/R_2 + R_3$ and is also shifted negatively as evidenced by the $V_{EE}$ $(1 - (R_3/R_2 + R_3))$ term. If, by way of example, resistors $R_2$ and $R_3$ are equal, the attenuation ratio is one half.

Assume now that diode $D_1$ is no longer reverse biased. Diode $D_1$ in combination with resistor $R_7$ now provides an additional shunt path for the conduction of current between node 20 and terminal 10. This conduction path significantly alters the attenuation ratio. Under this condition (assuming for ease of explanation that diode $D_1$ is in ideal diode and may be treated as a closed switch with its voltage drop $V_F = 0$), resistor $R_3$ is placed in parallel with resistor $R_7$. The parallel combination results in a net value of resistance between junction point 20 and terminal 10 which is less than the value of resistance with only resistor $R_3$ as above. Where $R_7$ is, for example, one half of $R_3$ the parallel combination of $R_3$ and $R_7$ would have a value of $R_3/3$ and the attenuation ratio for $R_2$ equal to $R_3$ would now be one quarter. The input signal would thus be considerably attenuated.

It is, therefore, evident that by controlling that portion of the input signal current which flows through the shunt path comprising diode $D_1$ and resistor $R_7$ that the potential at node 20, ($V_B$), can be controlled. Note that the attenuation ratio may vary linearly between these two values as a function of the forward conduction of diode $D_1$.

It remains to be shown that the conduction of diode $D_1$ is controlled by transistor $Q_5$ and that this in turn depends on the conductivity of transistor $Q_2$ which in turn depends on $V_B$ and on $V_{IN}$. It also remains to be shown that the attenuation ratio with current flowing through the shunt path must be selected to prevent $V_B$ from rising above $V_C$ of transistor $Q_2$ for the condition of maximum input signal.

This may best be done by using typical numbers based on a circuit in which the following parameters were selected.

| | |
|---|---|
| $V_{CC} = +5$ volts | $R_5 = 178$ ohms |
| $V_{EE} = -5$ volts | $R_6 = 178$ ohms |
| $R_1 = 3$ kohms | $R_7 = 1.7$ kohms |
| $R_2 = 2.04$ kohms | $V_{REF_1} = -1.25$ volts |
| $R_3 = 2.96$ kohms | $V_{REF_2} = -3.55$ volts |
| $R_4 = 128$ ohms | |

For values of $V_{IN}$ above 2.1 volts, the output $V_o$ should go low (−1.7 volts) and for values of $V_{IN}$ below 2.1 volts, $V_o$ should go high (−0.8 volts). The $V_{REF}$ potential was selected to be −1.25 volts. The threshold point for the ECL circuit may be defined as the point at which $V_B$ is equal to −1.25 volts and at that point $V_{IN}$ = 2.1 volts. Selecting the value of $V_B$ for a given $V_{IN}$ determines the ratio of $R_2$ and $R_3$. Note that this does not mean that their values are fixed, only that the ratio of one to the other is determined. The current lever $I_K$ is set and the values of $R_5$ and $R_6$ are selected to produce output signals $V_o$ and $V_o$ which are compatible with the other ECL circuits. For the condition when $V_B$ is −1.25 volts, the $V_B$ (−1.25 volts) is the anode voltage of diode $D_1$ and that $V_o$ (−1.25 volts) is the cathode voltage of diode $D_1$. Diode $D_1$ thus has a forward bias of zero volts and is nonconducting. The diode, therefore, looks like a relatively high impedance and substantially no current flows through it.

Before discussing the condition when $V_{IN}$ goes above 2.1 volts, it should be clear that for all values of $V_{IN}$ below 2.1 volts the base voltage is more negative than −1.25 volts and diode $D_1$ is always reverse biased and may be considered to be an open switch.

When $V_{IN}$ increases, for example, from 2.1 volts to 2.40 volts, it is desired that the output $V_o$ be switched to the −1.7 volt level. When $V_{IN}$ equals +2.40 volts, $V_B$ goes to −1.080 volts. The full current $I_K$ flows through transistor $Q_2$, $V_C$ of transistor $Q_2$ goes to −0.9 volts and $V_o$ goes to −1.7 volts. Note that now diode $D_1$ has −1.08 volts at its anode and −1.7 volts at its cathode. There is thus a forward bias of 0.62 volts across the diode. Note that the diode though not fully conducting already has a relatively low impedance. As $V_{IN}$ increases still further, the potential V′ increases correspondingly and $V_B$ will increase somewhat until $V_B$ reaches −0.9 volts. However, this level (−0.9 volts) is not exceeded even for $V_{IN}$ = 5.0 volts.

The values of $R_2$, $R_3$, and $R_7$ are selected so that for $V_B$ = −0.9 volts the current through $R_2$ $$I_{R2} = \frac{V'_{\max} - (-0.9v)}{R_2}$$

is equal to or less than the sum of the currents through resistor $R_3$ $$I_{R3} = [-0.9v - (-V_{EE})/R_3]$$

and through resistor $R_7$ $$I_{R7} = [-0.9v - (-V_{EE}) - V_{BE}/R_7]$$

That is, $I_{R2} \leq I_{R3} + I_{R7}$. Based on this criteria the resistor values of $R_2$, $R_3$ and $R_7$ may be selected so that $V_B$ does not exceed a voltage which would cause saturation of $Q_2$.

Though the invention has been illustrated with digital logic circuits, it should be evident that transistor $Q_2$ instead of being part of an ECL gate could be part of the input stage of a linear circuit and that the signal $V_{IN}$ could be produced by any arbitrary linear or digital signal source.

It should also be evident that the feedback signal to control the conduction of the shunt path could be derived from the emitter circuit of transistor $Q_2$ since the emitter voltage follows the base voltage. The feedback signal could thus be derived from emitter instead of from the collector of transistor $Q_2$.

What is claimed is:

1. The combination comprising:

first and second points for the application therebetween of an operating potential;

a transistor having a base, an emitter and a collector;

means connecting the emitter to said first point of potential and impedance means connecting the collector to said second point of potential;

means for applying signals to the base of said transistor;

a selectively operable shunt path, which includes a single diode which normally does not conduct, connected between the base of said transistor and said first point of potential for when operable providing an additional current path to the applied signal; and normally conducting feedback means including at least one active element connected between the collector of said transistor and said shunt path, said feedback means applying a reverse bias to said diode and simultaneously providing all the current flowing in said shunt path for preventing the conduction of signal current through said shunt path when the signal applied to the base of said transistor is below a given voltage level and said feedback means providing a decreasing amount of current to said shunt path for permitting an increasing amount of signal current in said shunt path when the applied signal increases above said given voltage level.

2. In combination:

first and second terminals for the application therebetween of an operating potential;

a transistor having base, emitter, and collector electrodes;

impedance means connected between said collector electrode and said first terminal and means connecting said emitter electrode to said second terminal;

means for applying input signals to said base electrode, the voltage at said collector electrode being an inverse function of the input signal;

a shunt path including solely a single diode in series with a resistor, said shunt path being connected between said base and a point of reference potential; and feedback circuit means, including at least one active element, connected between said collector electrode and the connection of said diode to said resistor; said feedback means being responsive to the voltage at said collector electrode, said voltage being in turn responsive to said input signals; said feedback circuit means in response to input signals of less than a given value applying a reverse bias to said diode and providing all the current flowing in said resistor, and said feedback circuit means in response to input signals of greater than said given value applying a voltage to said diode in a direction to forward bias said diode for enabling a linear increase in the signal current through said shunt path while simultaneously decreasing the portion of the feedback current flowing through said resistor of said shunt path.

3. In combination:

a transistor having a control electrode, an emitter of charge carriers and a collector of charge carriers;

an input circuit connected to said control electrode including an impedance coupled between said control electrode and a point of reference potential;

means for applying an input signal to said input circuit;

a normally open by-pass circuit connected across said impedance; and normally conducting feedback circuit means connected between said collector of charge carriers and said by-pass circuit; said feedback circuit including at least one active element and being responsive to the voltage at said collector of charge carriers, where said voltage is an inverse function of said input signal; said feedback circuit means providing a current in said by-pass circuit of sufficient magnitude to block the flow of input signal current in the by-pass circuit when the input signal is less than a given value and said feedback circuit providing a decreasing current in said by-pass circuit for linearly closing said by-pass circuit and enabling signal current to pass in said by-pass circuit when the input signal is greater than said given value.

4. In the combination as set forth in claim 3, said by-pass circuit comprised solely of a diode in series with a resistor, said feedback circuit being connected to the connection of said diode to said resistor and normally maintaining said diode reverse biased, said feedback circuit in response to an input signal of greater than a given value feeding back a voltage to said diode of a sense to forward bias said diode.

5. In the combination as set forth in claim 4, said active element in said feedback circuit including a second transistor having an emitter-to-base diode, said second transistor being connected at its base to said collector of charge carriers of the first mentioned transistor and being connected at its emitter to the connection between said diode and said resistor.

6. In the combination as set forth in claim 3, said active element in said feedback circuit including a second transistor, said second transistor having an emitter-to-base diode and being connected at its base to said collector electrode and at its emitter to said by-pass circuit.

7. The combination comprising:

first and second points of operating potential;

a first transistor having a base, an emitter, and a collector;

means connecting said emitter to said first point of potential;

load means connected between said collector and said second point of potential;

means for applying signals to the base of said transistor;

a clamping circuit connected between the base of said transistor and said first point of potential comprised solely of a diode in series with a resistor, the diode having its anode connected to the base of said transistor and its cathode connected to one end of the resistor, the other end of the resistor being connected to said first point of potential; and feedback means, including a second transistor having its base connected to the collector of said first transistor, its collector connected to said second point of potential, and its emitter connected to the cathode of said diode for providing current to said resistor and maintaining said diode reversed biased for input signals below a given level and providing less circuit to said resistor for enabling a linear increase in the conduction of input signal current through said diode and said resistor for input signals greater than said given value.

8. The combination as claimed in claim 7 further including a third transistor, said third transistor having its emitter connected to the emitter of said first transistor, and further including means for applying a reference potential to the base of said third transistor, said third transistor being conductive and said first transistor being rendered non-conductive when the signal applied to the base of said first transistor is lower in amplitude than said reference potential and said third transistor being rendered non-conductive and said first transistor being rendered conductive when the signal applied to the base is higher in amplitude than said reference potential.

9. The combination as claimed in claim 7 wherein said second transistor is a multi-emitter transistor, one emitter of said second transistor being connected to the cathode of said diode and another one of the emitters of said transistors being connected to an output terminal for producing thereat output signals having a first value when the input signal is below a given level and a second value when the input signal is above said given level.

10. The combination as claimed in claim 7 wherein said means for applying signals to the base of said first transistor includes an input terminal for the application thereto of signals from a signal source producing signals of relatively large amplitude, and further includes an attenuation and level shifting network connected between said terminal and the base of said first transistor.

11. The combination as claimed in claim 10, wherein said attenuation and level shifting network includes a first impedance coupled between said input terminal and the base of said first transistor and a second impedance connected between the base of said transistor and said first point of potential.

* * * * *

UNITED STATES PATENT OFFICE
CERTIFICATE OF CORRECTION

Patent No. 3,755,693 Dated August 28, 1973

Inventor(s) James Yat Lee

It is certified that error appears in the above-identified patent and that said Letters Patent are hereby corrected as shown below:

Col. 2, line 52 :
Col. 3, line 16 :
Col. 4, line 66 : (second occurrence)

It appears in our application that the $V_o$ on each of these lines should be $\overline{V}_o$.

Col. 5, first equation. There should be brackets before $I_{R2}$ and after 9v).

$$[I_{R2} = \frac{V' \max - (-0.9v)]}{R_2}$$

second equation - the bracket before -0.9v should be taken out and placed before $I_{R3}$.

third equation - the bracket before -0.9v should be taken out and placed before $I_{R7}$.

Signed and sealed this 23rd day of April 1974.

(SEAL)
Attest:

EDWARD M.FLETCHER,JR.
Attesting Officer

C. MARSHALL DANN
Commissioner of Patents